United States Patent
Yu

(10) Patent No.: US 7,224,425 B2
(45) Date of Patent: May 29, 2007

(54) SYSTEM AND METHOD OF MANUFACTURING LIQUID CRYSTAL DISPLAY WHEREIN THE BONDING OF THE PRINTED CIRCUIT FILM ON THE PANEL ASSEMBLY IS INSPECTED

(75) Inventor: In-Kwang Yu, Cheonan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 31 days.

(21) Appl. No.: 10/787,234

(22) Filed: Feb. 27, 2004

(65) Prior Publication Data

US 2005/0174526 A1 Aug. 11, 2005

(30) Foreign Application Priority Data

Feb. 6, 2004 (KR) .................. 10-2004-0007816

(51) Int. Cl.
*G02F 1/13* (2006.01)
*G02F 1/1345* (2006.01)

(52) U.S. Cl. ................. 349/187; 349/149; 349/150
(58) Field of Classification Search ............. 349/187
See application file for complete search history.

(56) References Cited

U.S. PATENT DOCUMENTS

| 5,777,610 A | * | 7/1998 | Sugimoto et al. | ........... 345/206 |
| 6,414,741 B2 | * | 7/2002 | Hasegawa et al. | .......... 349/187 |
| 2004/0046909 A1 | * | 3/2004 | Sekiguchi | ................ 349/113 |

* cited by examiner

*Primary Examiner*—Andrew Schechter
*Assistant Examiner*—W. Patty Chen
(74) *Attorney, Agent, or Firm*—F. Chau & Associates, LLC

(57) ABSTRACT

A liquid crystal panel assembly is manufactured and a printed circuit film such as a tape carrier package (TCP) is bonded on the panel assembly. The bonding of the printed circuit film on the panel assembly is inspected using a differential camera, a different scope, etc. A printed circuit board (PCB) is bonded to the printed circuit film and the bonding of the printed circuit film on the panel assembly is inspected again.

17 Claims, 7 Drawing Sheets

SYSTEM AND METHOD OF MANUFACTURING LIQUID CRYSTAL DISPLAY WHEREIN THE BONDING OF THE PRINTED CIRCUIT FILM ON THE PANEL ASSEMBLY IS INSPECTED

BACKGROUND OF THE INVENTION (a) Field of the Invention

The present invention relates to a system and a method of manufacturing a liquid crystal display.

(b) Description of Related Art

A liquid crystal display (LCD) includes a liquid crystal (LC) panel assembly including a pair of panels provided with field-generating electrodes and a LC layer interposed therebetween. The field-generating electrodes are supplied with voltages to generate electric field for rearranging LC molecules in the LC layer, thereby controlling light passing through the LC layer. The panel assembly further includes a plurality of signal lines for transmitting the voltages to the field-generating electrodes.

The LCD further includes a plurality of driving circuits connected to the signals lines for supplying signals thereto. The driving circuits are formed of integrated circuit (IC) chips. The driving IC chip is mounted on a flexible printed circuit (FPC) film including an insulating film made of polyimide and provided with a plurality of conductive leads printed thereon. The FPC film mounting the driving IC chip called tape carrier package (TCP) is bonded by tape automated bonding (TAB) such that the IC chip is electrically connected to the signal lines on the panel assembly through the leads on the TCP.

The leads of the TCP include a plurality of input and output leads respectively connected to input and output terminals of the IC chip mounted on the TCP, and the signal lines of the panel assembly include a plurality of pads disposed near edges of the panel assembly. The output leads of the TCP are physically and electrically connected to the pads of the panel assembly, while the input leads of the TCP are connected by soldering to a printed circuit board for supplying several signals to the driving IC.

The bonding of the output leads of the TCP and the pads of the panel assembly is performed by interposing an anisotropic conductive film (ACF) therebetween, which are made of thermosetting or thermo thermoplastic resin containing a plurality of conductive particles dispersed therein, and by thermocompression with a heating tool made of metal or ceramics.

Since the heating tool generates high temperature for reliable bonding, it may be deformed by the high temperature to decrease its flatness and its life. The high temperature may also cause defects in a joint of the heating tool and in the driving ICs and the panel assembly.

In particular, it is easy for the flatness of a large heating tool for a large LCD to be decreased. The lower flatness of the heating tool may fail to uniformly pressing the conductive particles of the ACF, thereby causing defect in connection between the TCP and the panel assembly.

SUMMARY OF THE INVENTION

A system of manufacturing a liquid crystal display is provided, which includes: a panel manufacturing unit for manufacturing a liquid crystal panel assembly including a thin film transistor (TFT) array panel, a color filter array panel, and a liquid crystal layer interposed between the TFT array panel and the color filter array panel; a printed circuit film bonding unit for bonding a printed circuit film on the panel assembly; a printed circuit board (PCB) bonding unit for bonding a PCB to the printed circuit film; and an inspection unit for inspecting the bonding of the printed circuit film on the panel assembly.

The printed circuit film may include a tape carrier package.

The inspection unit may include a differential camera or a differential scope.

The printed circuit film bonding unit bonds the printed circuit film on the panel assembly preferably with an anisotropic conductive film (ACF).

The ACF includes an adhesive containing a plurality of conductive particles and the printed circuit film bonding unit bonds the printed circuit film on the panel assembly by compression. The inspection unit may detect dents generated by the compression.

The inspection unit may detect alignment of the printed circuit film with the panel assembly.

The bonding inspection unit is incorporated into the printed circuit film bonding unit or the PCB bonding unit.

The bonding inspection unit may include two sub-units for inspection before and after the bonding of the PCB, respectively. One of the sub-units of the bonding inspection unit may be incorporated into the printed circuit film bonding unit and the other of the sub-units of the bonding inspection unit may be incorporated into the PCB bonding unit.

A method of manufacturing a liquid crystal display is provided, which includes: manufacturing a liquid crystal panel assembly; bonding a printed circuit film on the panel assembly; inspecting the bonding of the printed circuit film on the panel assembly; and bonding a printed circuit board (PCB) to the printed circuit film.

The inspection may be performed before the bonding of the PCB, and the method may further include: inspecting the bonding of the printed circuit film on the panel assembly again after the bonding of the PCB.

The inspection may be performed after the bonding of the PCB.

The printed circuit film may include a tape carrier package.

The inspection may be performed using a differential camera or a differential scope.

The printed circuit film may be bonded on the panel assembly with an anisotropic conductive film (ACF) containing a plurality of conductive particles, and the bonding of the printed circuit film may be performed by thermocompression. The inspection may detect dents generated by the thermocompression.

BRIEF DESCRIPTION OF THE DRAWINGS

The present invention will become more apparent by describing embodiments thereof in detail with reference to the accompanying drawing in which.

DETAILED DESCRIPTION OF EMBODIMENTS

Figure 1:
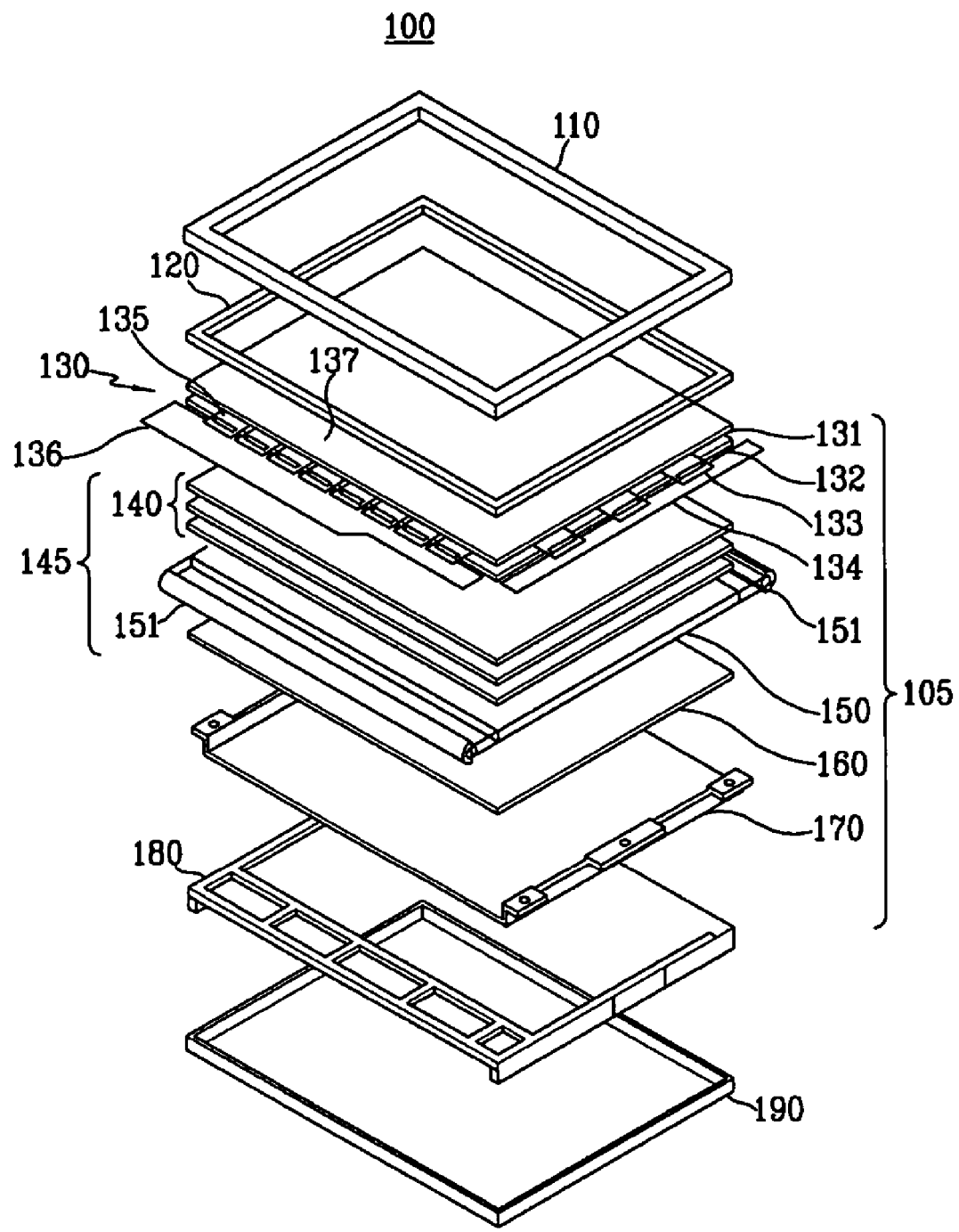
FIG. 1 is an exploded perspective view of an LCD manufactured by a manufacturing system according to an embodiment of the present invention.

The present invention now will be described more fully hereinafter with reference to the accompanying drawings, in which embodiments of the invention are shown.

In the drawings, the thickness of layers and regions are exaggerated for clarity. Like numerals refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Then, a system and a method of manufacturing a liquid crystal display (LCD) will be described with reference to accompanying drawings.

FIG. 1 is an exploded perspective view of an LCD manufactured by a manufacturing system according to an embodiment of the present invention.

Referring to FIG. 1, an LCD 100 manufactured by a manufacturing system according to an embodiment of the present invention includes an LC module 105, and front and rear cases 110 and 190 for protecting the LC module 105. The LC module 105 includes a display unit 130 for displaying images and a backlight unit 145 disposed under the display unit 130 for illuminating the display unit 130. The display unit 130 includes a LC panel assembly 137, a plurality of data tape carrier packages (TCPs) 135, a data printed circuit board (PCB) 136, a plurality of gate TCPs 133, and a gate PCB 134.

The LC panel assembly 137 includes a thin film transistor (TFT) array panel 132, a color filter array panel 131 facing the TFT array panel 132, and a liquid crystal layer (not shown) interposed between the panels 131 and 132. The TFT array panel 132 is provided with a plurality of pixel electrodes (not shown) arranged in a matrix, a plurality of TFTs (not shown) for selectively transmitting signals to the pixel electrodes, and a plurality of gate lines (not shown) and data lines (not shown) connected to the TFTs.

The data lines and the gate lines are electrically connected to the data PCB 136 and the gate PCB 134 through the data TCP 135 and the gate TCP 133, respectively. In detail, the data PCB 136 and the gate PCB 134 transmit electrical signals, which are received from external devices or generated by themselves and include image signals and control signals for controlling the image signals, to the gate lines and the data lines through the data TCP 135 and the gate TCP 133.

The color filter array panel 131 includes a plurality of color filters for color display and a common electrode for generating electric fields in cooperation with the pixel electrodes. The electric fields are generated by applying voltages to the pixel electrodes and the common electrode and determine the orientations of LC molecules in the LC layer.

The backlight unit 145 includes a pair of lamp units 151 for emitting light and a light guide 150 for guiding the light from the lamp units 151 to the LC panel assembly 137. Each lamp unit 151 includes at least a lamp emitting light and a lamp cover for protecting the lamp and the lamps shown in FIG. 1 are located near edges of the light guide 150, which is called edge type. The light guide 150 is disposed under the LC panel assembly 137 and it has a size substantially equal to that of the LC panel assembly 137. The light guide 150 shown in FIG. 1 has a uniform thickness.

The backlight unit 145 further includes a plurality of optical sheets 140, disposed on the light guide 150, for making the luminance of the light entering the LC panel assembly 137, and a reflector 160, disposed under the lamp guide 150, for reflecting the light out of the light guide 150 into the light guide 150, thereby increasing the light efficiency.

The configuration of the backlight unit 145 may be modified in various forms. For example, the lamps may be located between the LC panel assembly 137 and the light guide 150, which is called direct type. In addition, the backlight unit 145 may have only one lamp unit and the light guide 150 may have increasing or decreasing thickness.

The display unit 130 and the backlight unit 145 are received in a bottom chassis 170, which is fixed by a mold frame 180. The mold frame 180 has a large opening exposing a rear surface of the bottom chassis 170 and a plurality of small openings for facilitating the reception of circuit elements mounted on the data PCB 136 and the gate PCB 134.

The rear surface of the bottom chassis 170 exposed through the large opening of the mold frame 180 is provided with at least one inverter board (not shown) and a signal converter PCB (not shown). The inverter board transforms an external supply voltage into a driving voltage for the lamps of the lamp unit 151, and the signal converter PCB, which is connected to the data PCB 136 and the gate PCB 134, converts analog image signals into digital images signals to be supplied thereto.

A top chassis 120 is disposed on the display unit 130. The top chassis 120 curves the data PCB 136 and the gate PCB 134 out of the mold frame 180 and simultaneously, prevents the display unit 130 from being separated from the bottom chassis 170. The front case 110 on the top chassis 120 is assembled with the rear case 190 under the mold frame 180 to form the LCD 100.

Figure 2:
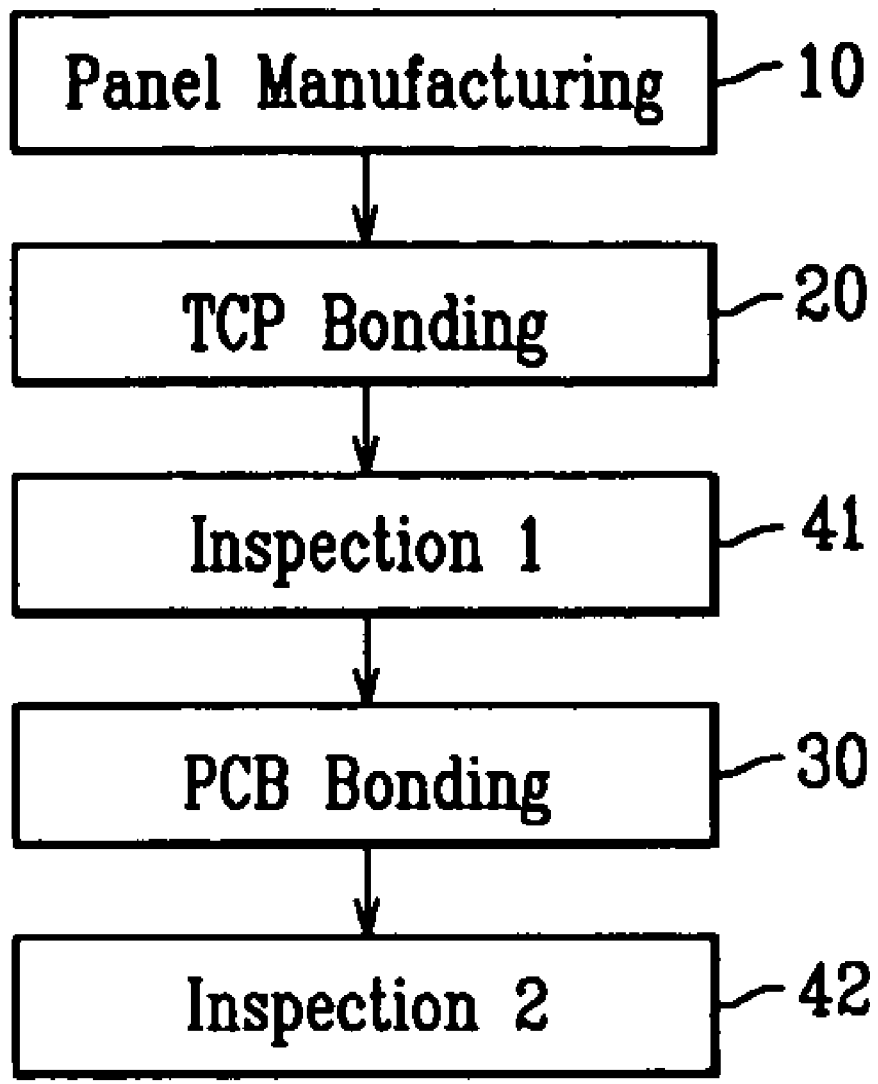
FIG. 2 is a block diagram of a system of manufacturing an LCD according to an embodiment of the present invention.

A system of manufacturing an LCD according to an embodiment of the present invention is described in with reference FIG. 2.

FIG. 2 is a block diagram of a system of manufacturing an LCD according to an embodiment of the present invention.

Referring to FIG. 2, a system of manufacturing an LCD according to an embodiment of the present invention includes an LC panel manufacturing unit 10, a TCP bonding unit 20, a PCB bonding unit 30, and first and second bonding inspection units 41 and 42.

The LC panel manufacturing unit 10 manufactures the LC panel assembly 137 including the TFT array panel 132, the color filter array panel 131, and the LC layer as shown in FIG. 1.

The TCP bonding unit 20 bonds the TCPs 133 and 135 on the LC panel assembly 137, and the PCB bonding unit 30 bonds the PCBs 134 and 136 to the TCPs 133 and 135.

The first and the second bonding inspection units 41 and 42 inspect the bonding of the TCPs 133 and 135 on the LC panel assembly 137 before and after the bonding of the PCBs 134 and 136, respectively. The bonding inspection units 41 and 42 preferably include a differential camera or a differential scope. The first and the second bonding inspection units 41 and 42 may be stand-alone devices or incorporated into the TCP bonding unit 20 and the PCB bonding unit 30, respectively. The first and the second bonding inspection units 41 and 42 may be substituted with a single bonding inspection unit used for inspection before and/or after the bonding of the PCBs 134 and 136.

Now, a method of manufacturing an LCD using the system shown in FIG. 2 according to an embodiment of the present invention is described in detail with reference to FIGS. 3A–7 as well as FIGS. 1 and 2.

FIGS. 3A to 7 sequentially illustrate a method of manufacturing an LCD according to an embodiment of the present invention.

Referring to FIGS. 1 and 2, an LC panel assembly 137 including a TFT array panel 132, a color filter array panel 131, and a liquid crystal layer is manufactured using the panel manufacturing unit 10. Thereafter, a plurality of TCPs 133 and 135 are bonded to the TFT array panel 132 using the TCP bonding unit 20, and the boding of the TCPs 133 and 135 are inspected using the first bonding inspection unit 41. Subsequently, PCBs 134 and 136 are soldered to the TCPs 133 and 135, respectively, using the PCB bonding unit 30 and the bonding of the TCPs 133 and 135 on the TFT array panel 132 are inspected again using the second bonding inspection unit 42. An exemplary boding of gate TCPs 133 will be described more in detail with reference to FIGS. 3A–7.

Figure 3A:
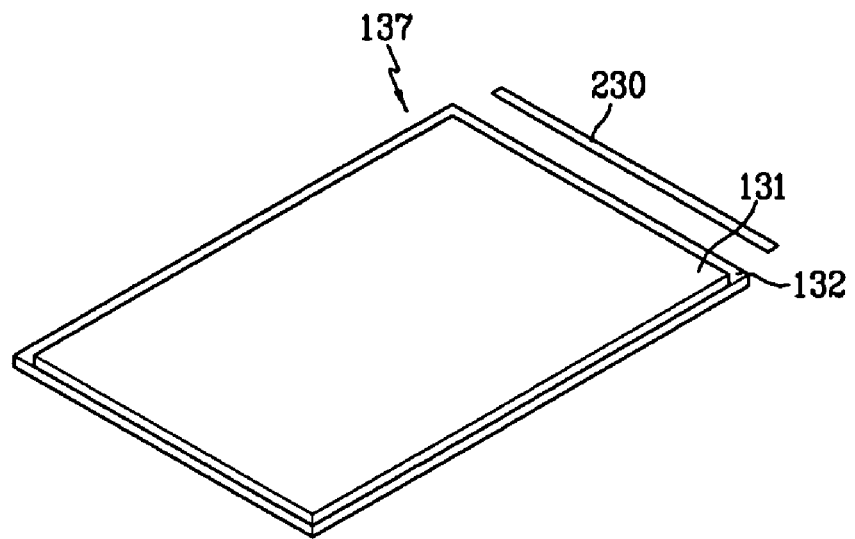
FIGS. 3A to 7 sequentially illustrate a method of manufacturing an LCD according to an embodiment of the present invention.
Figure 3B:
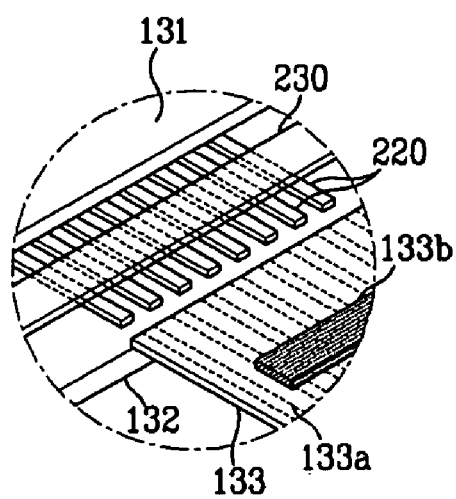

An anisotropic conductive film (ACF) 230 is applied on gate pads 220 of the gate lines on the TFT array panel 132 of the LC panel assembly 137 as shown in FIGS. 3A and 3B. The ACF 230 includes a thermosetting or thermoplastic adhesive resin 230b and a plurality of conductive particles 230a dispersed in the resin 230b.

Figure 4A:
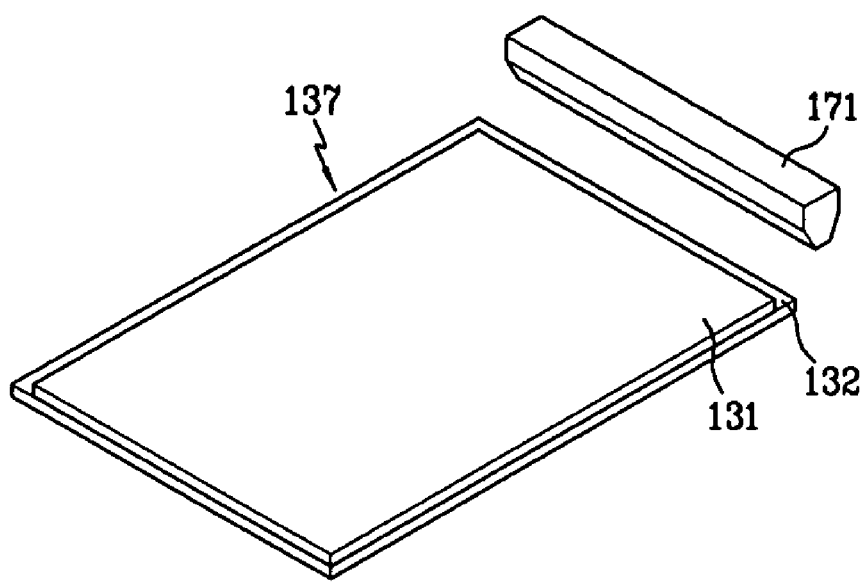
Figure 4B:
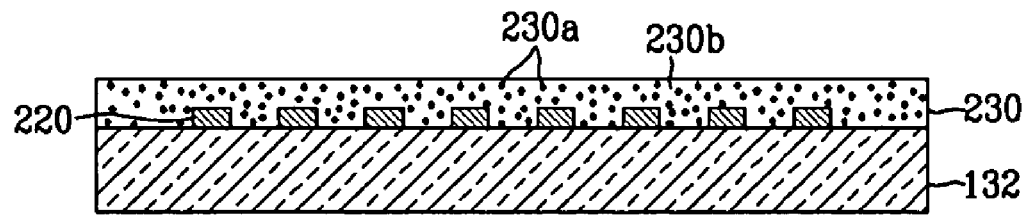

Referring to FIGS. 4A and 4B, the ACF 230 is pre-cured by a pre-heating head 171 of the TCP bonding unit 20 or a separate ACF bonding machine.

Figure 5A:
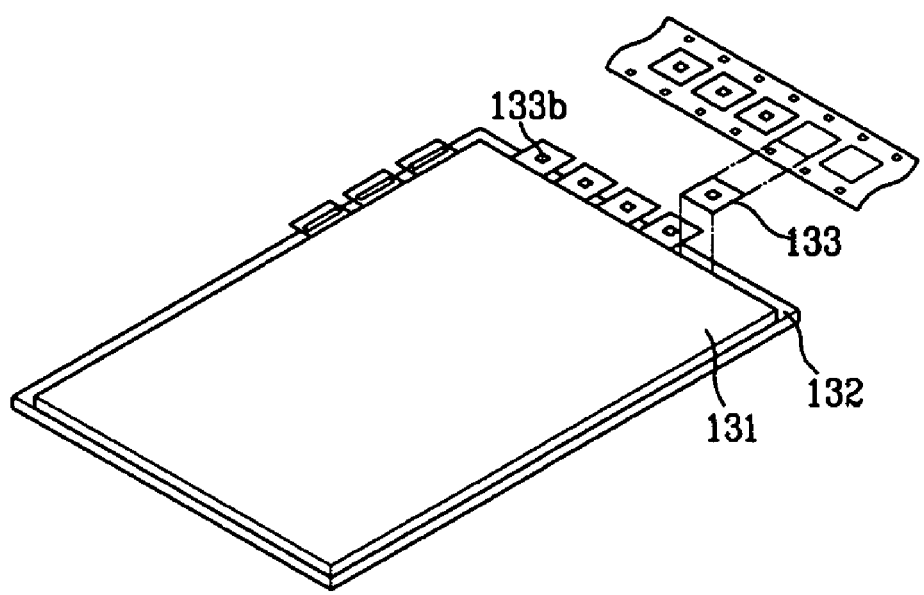
Figure 5B:
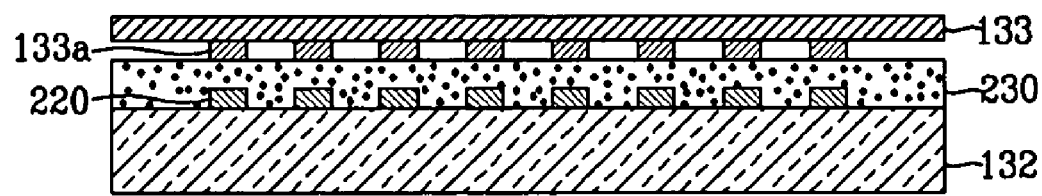

Referring to FIGS. 5A and 5B, leads 133a of a gate TCP 133 mounting a driving IC chip 133b are aligned with the gate pads 220 of the LC panel assembly 137 using a CCD (charge coupled device) and the gate TCP 133 is pre-pressed. It is noted that some of the leads 133a are not connected to the driving IC chip 133b, while the other of the leads 133a are connected thereto, and the TCP bonding unit 20 may bond a FPC film without mounting a chip on the LC panel assembly 137.

Figure 6A:
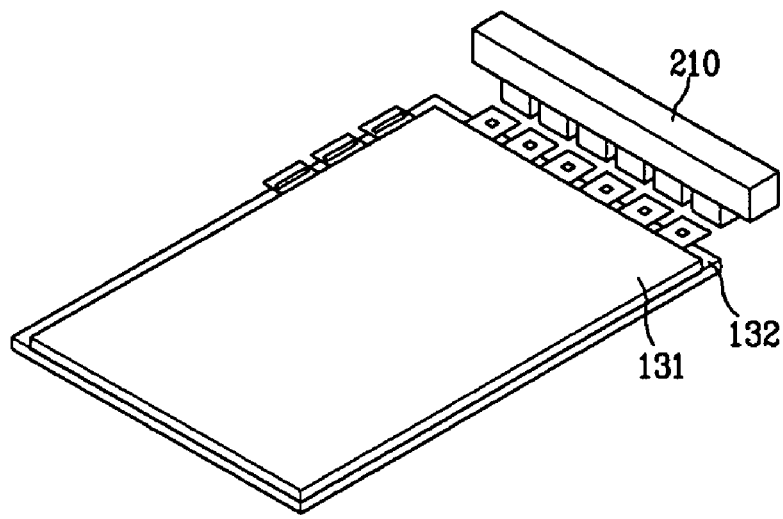
Figure 6B:
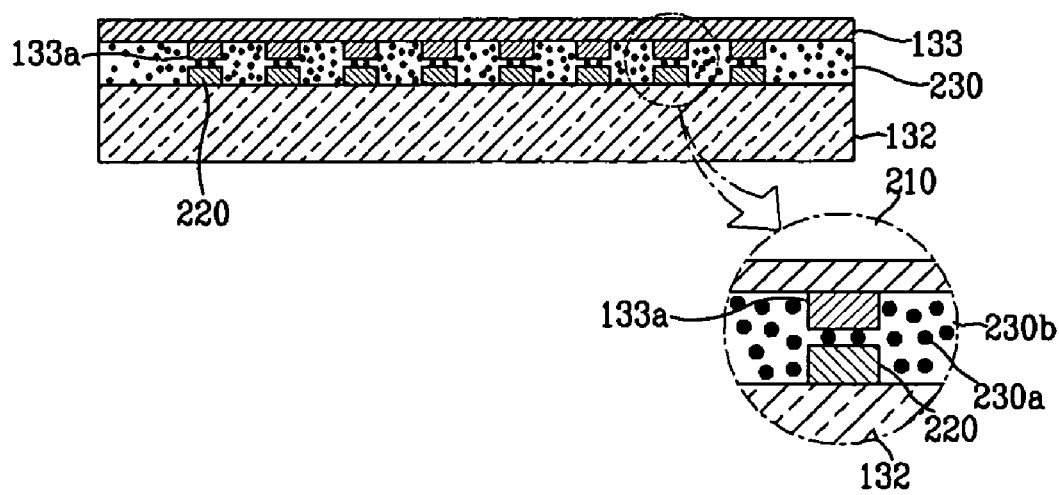

Referring to FIGS. 6A and 6B, the ACF 230 is cured with a pressure using a thermocompression head 210 of the TCP bonding unit 20 such that the gate pads 220 of the gate lines and the leads 133a of the gate TCP 133 are electrically connected through the conductive particles 230a by heat press.

Thereafter, the bonding of the TCP 133 on the LC panel assembly 137 is inspected by using the first inspection unit 41. The inspection is preferably performed by detecting dents generated by the heat press.

If the number of the conductive particles 230a interposed between the gate pads 220 and the leads 133a after heat press, which is called a dent number, is uniform for each pair of the gate pads 220 and the leads 133a, it is considered that the bonding of the gate pads 220 and the leads 133a is successful and thus a defect of the connection therebetween may not be generated.

If the dent number is not uniform, the bonding is considered to be failed. Accordingly, the TCP 133 may be detached from the panel 132 and another TCP may be attached on the panel 132 according to the above-described procedure. At this time, since the uniformity of the dent number is significantly depending on the parallelism of the heat pressing head 210 and the gate pads 220, the heat pressing head 210 is adjusted to be parallel to the gate pads 220 by a degree smaller than a few microns based on the distribution of the dent number. In addition, the distribution of the process temperature and pressure may be also adjusted to be uniform and the heating tool may be cleaned to remove foreign substance.

Since the bonding inspection unit 41 such as a differential optical range camera can detect edges of the gate pads 220 and the leads 133a, the alignment between the gate pads 220 and the leads 133a is also inspected.

Figure 7:
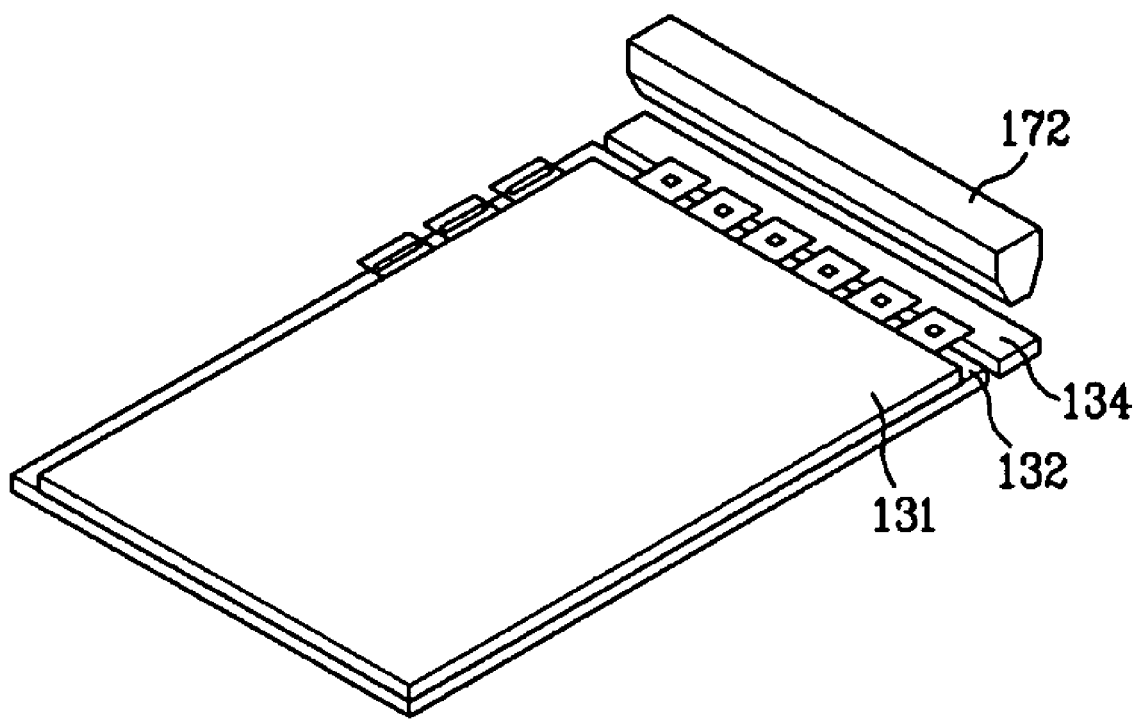

Subsequently, input leads (not shown) of the TCP 133 are connected to output bonding pads (not shown) of the PCB 134 using a soldering head 172 of the PCB bonding unit 30 as shown in FIG. 7.

Thereafter, the bonding of the TCP 133 on the LC panel assembly 137 is inspected again using the second bonding inspection unit 42.

The inspection may be performed once either before or after the bonding of the PCB 134.

The above-described inspection of the bonding of the TCPs 133 and 135 on the LC panel assembly 137 using the bonding inspection units 41 and 42 such as a differential camera or a differential scope ensures the reliability of the TCP bonding process.

In addition, since the inline inspection can be established, it is advantageous to manage the product flow and the product defect in terms of logistics.

Although preferred embodiments of the present invention have been described in detail hereinabove, it should be clearly understood that many variations and/or modifications of the basic inventive concepts herein taught which may appear to those skilled in the present art will still fall within the spirit and scope of the present invention, as defined in the appended claims.

What is claimed is:

1. A system of manufacturing a liquid crystal display, the system comprising:
    a panel manufacturing unit for manufacturing a liquid crystal panel assembly including a thin film transistor (TFT) array panel, a color filter array panel, and a liquid crystal layer interposed between the TFT array panel and the color filter array panel;
    a printed circuit film bonding unit that bonds by compression a printed circuit film on the panel assembly with an adhesive containing a plurality of conductive particles;
    a printed circuit board (PCB) bonding unit for bonding a PCB to the printed circuit film; and
    an inspection unit for inspecting the bonding of the printed circuit film on the panel assembly and determining whether a dent number is uniform, wherein the dent number is the number of conductive particles between the gate pads of the TFT array panel and leads on said printed circuit film.

2. The system of claim 1, wherein the printed circuit film comprises a tape carrier package.

3. The system of claim 1, wherein the inspection unit comprise a differential camera or a differentials scope.

4. The system of claim 1, wherein the printed circuit film bonding unit bonds the printed circuit film on the panel assembly with an anisotropic conductive film (ACF).

5. The system of claim 4, wherein the ACF comprises an adhesive containing a plurality of conductive particles.

6. The system of claim 5, wherein the printed circuit film bonding unit bonds the printed circuit film, on the panel assembly by compression.

7. The system of claim 1, wherein the inspection unit detects alignment of the printed circuit film with the panel assembly.

8. The system of claim 1, wherein the bonding inspection unit is incorporated into the printed circuit film bonding unit or the PCB bonding unit.

9. The system of claim 1, wherein the bonding inspection unit comprises two sub-units for inspection before and after the bonding of the PCB, respectively.

10. The system of claim 9, wherein one of the sub-units of the bonding inspection unit is incorporated into the printed circuit bonding unit and the other of the sub-units of the bonding inspection unit is incorporated into the PCB bonding unit.

11. A method of manufacturing as liquid crystal display, the method comprising:
   manufacturing a liquid crystal panel assembly;
   bonding a printed circuit film on the panel assembly by thermocompression, wherein the printed circuit film is bonded on the panel assembly with an anisotropic conductive film (ACF) containing a plurality of conductive particles;
   bonding a printed circuit board (PCB) to the printed circuit film, and
   inspecting the bonding of the printed circuit film on the panel assembly and detecting whether a dent number is uniform, wherein the dent number is the number of conductive particles between the gate pads of the TFT array panel and leads on said printed circuit film.

12. The method of claim 11, wherein the printed circuit film comprises a tape carrier package.

13. The method of claim 11, wherein the inspection is performed using a differential camera or a differentials scope.

14. The method of claim 11, wherein the inspection is performed before the bonding of the PCB.

15. The method of claim 14, further comprising inspecting the bonding of the printed circuit film on the panel assemble again after the bonding of the PCB.

16. The method of claim 11, wherein the inspection is performed after the bonding of the PCB.

17. The method of claim 11, further comprising
   applying the anisotropic conductive film on the panel assembly before bonding a printed circuit film on the panel assembly,
pre-curing the anisotropic conductive film by using a pre-heating head, and
pre-pressing the printed circuit film on the anisotropic conductive film.

* * * * *